United States Patent [19]
Lee

[11] Patent Number: 5,969,999
[45] Date of Patent: Oct. 19, 1999

[54] MERGED MEMORY LOGIC INTEGRATED CIRCUITS INCLUDING BUFFERS DRIVEN BY ADJUSTABLY DELAYED CLOCK SIGNALS

[75] Inventor: Cheol-Ha Lee, Kyungki-do, Rep. of Korea

[73] Assignee: Samsung Electronics Co., Ltd., Rep. of Korea

[21] Appl. No.: 08/994,506

[22] Filed: Dec. 19, 1997

[30] Foreign Application Priority Data

Jul. 29, 1997 [KR] Rep. of Korea ................. 1997-35777

[51] Int. Cl.[6] ................................................... G11C 7/00
[52] U.S. Cl. ..................... 365/194; 365/189.05; 365/195
[58] Field of Search .............................. 365/194, 189.05, 365/195, 191

[56] References Cited

U.S. PATENT DOCUMENTS 5,831,929  11/1998  Manning .............................. 365/194 X
5,838,630  11/1998  Okajima .............................. 365/194 X
5,841,707  11/1998  Cline et al. .............................. 365/194

*Primary Examiner*—Don Hyun Yoo
*Attorney, Agent, or Firm*—Myers Bigel Sibley & Sajovec

[57] ABSTRACT

A merged memory logic (MML) integrated circuit includes an adjustable clock generator configured to receive a input clock signal and produce an adjustably delayed clock signal therefrom responsively to a control signal generated by a programmable logic circuit. A buffer has a clock input for receiving the adjustably delayed clock signal and is configured to receive an input data signal and produce a corresponding output data signal therefrom responsive to the adjustably delayed clock signal. The adjustable clock generator preferably includes a clock generator configured to receive the input clock signal and produce a output clock signal therefrom, and an adjustable delay circuit which receives the output clock signal and generates the adjustably delayed clock signal therefrom, the adjustably delayed clock signal being delayed by a selected one of a plurality of selectable delay intervals with respect to the output clock signal. The adjustable delay circuit may include a plurality of delay circuits, a respective one of which is configured to receive the output clock signal and produce a respective delayed clock signal therefrom, the delayed clock signal being delayed a respective predetermined delay with respect to the output clock signal. One of the delayed clock signals is selectively coupled to the clock input of the buffer, preferably through a switch of a plurality of switches which are operative to connect the plurality of delay circuits to the clock input of the buffer.

19 Claims, 4 Drawing Sheets

MERGED MEMORY LOGIC INTEGRATED CIRCUITS INCLUDING BUFFERS DRIVEN BY ADJUSTABLY DELAYED CLOCK SIGNALS

FIELD OF THE INVENTION

The present invention relates to integrated circuits, more particularly, to buffers and related circuits for integrated circuits.

BACKGROUND OF THE INVENTION

Merged memory logic (MML) integrated circuits are conventionally used in lightweight or compact systems to provide high performance and reduced power consumption. A typical MML integrated circuit includes memory, e.g., a dynamic random access memory (DRAM) or a static random access memory (SRAM), along with logic appropriate to control the memory, combined on a single chip. Typically, the logic controls the writing and reading of data in the memory.

FIG. 1 is a block diagram of a conventional semiconductor memory integrated circuit 101. The integrated circuit 101 includes an input terminal clock buffer 111, an input buffer 121, an output terminal clock buffer 141, an output buffer 131 and a memory 151. The input terminal clock buffer 111 generates an internal clock signal PCLK in response to an external clock signal CLK. The input buffer 121 transmits received data DI1 to the memory 151 in response to the internal clock signal PCLK. The input terminal clock buffer 111 includes an internal clock generator 113 for generating the internal clock signal PCLK from the external clock signal CLK, the internal clock signal being delayed by an interval introduced by a delay 115.

Similarly, the output terminal clock buffer 141 generates an output clock signal DLKDO in response to the clock signal CLK. The output buffer 131 produces data DQ2 from data DQ1 received from the memory 151 in response to the output clock signal DLKDO. The output terminal clock buffer 141 includes an output control clock generator 143 for converting the clock signal CLK to the output clock signal DLKDO, delayed by an interval introduced by a delay 145.

Variations in process conditions can cause variations in the timing characteristics, e.g., setup and hold times, of memory integrated circuits. Compensation for these variations may require changes to the masks of the delays or other structures in the memory integrated circuit, often resulting in production delays, increased cost, and the like.

SUMMARY OF THE INVENTION

In light of the foregoing, it is an object of the present invention to provide memory integrated circuits and clock generating circuits therefor which can be compensated to address timing variations without requiring mask changes or other undesirable redesign measures.

It is another object of the present invention to provide methods for compensating integrated circuit buffers for timing variations which may be performed without requiring mask changes or other redesign measures.

These and other objects, features and advantages are provided according to the present invention by integrated circuits which incorporate buffers driven by adjustably delayed clock signals which are controlled by a programmable logic circuit. Preferably, one of a plurality of predetermined delays may be selectively introduced into a clock signal used to control a buffer. In a preferred embodiment, a plurality of switches connects a like plurality of delay circuits between a clock generator and the clock input of the buffer. A programmably adjustable clock signal provides a convenient mechanism for compensating for timing variations caused by process conditions without requiring redesign of the memory integrated circuit.

In particular, according to the present invention, a merged memory logic (MML) integrated circuit includes a memory. An adjustable clock generator is configured to produce an adjustably delayed clock signal, the adjustably delayed clock signal being delayed responsively to a control signal applied to the adjustable clock generator. A buffer, operatively associated with the memory, has a clock input for receiving the adjustably delayed clock signal and is configured to receive an input data signal and produce a corresponding output data signal therefrom responsive to the adjustably delayed clock signal. A programmable logic circuit is operatively associated with the adjustable clock generator that is configured to produce the control signal according to a program applied thereto. The adjustable clock generator preferably is configured to receive an input clock signal and produce the adjustably delayed clock signal therefrom, the adjustably delayed clock signal being delayed with respect to the input clock signal by an adjustable interval. The adjustable clock generator preferably includes clock generator configured to receive the input clock signal and produce a output clock signal therefrom, and an adjustable delay circuit which receives the output clock signal and generates the adjustably delayed clock signal therefrom, the adjustably delayed clock signal being delayed with respect to the output clock signal by a selected one of a plurality of selectable delay intervals.

According to another embodiment of the present invention, the adjustable delay circuit comprises a plurality of delay circuits, a respective one of which is configured to receive the output clock signal and produce a respective delayed clock signal therefrom, the delayed clock signal being delayed a respective predetermined delay with respect to the output clock signal. Means are provided, operatively associated with the plurality of delay circuits, for selectively coupling one of the delayed clock signals to the clock input of the buffer. In a preferred embodiment, the means for selectively coupling comprises a plurality of switches, each of the plurality of switches having a first state in which the switch disconnects the associated delay circuit from the clock input of the buffer and a second state in which the switch connects the associated delay circuit to the clock input of the buffer. A respective one of the plurality of switches may be responsive to a respective control signal to produce one of the first and second states.

In yet another embodiment of the present invention, the programmable logic circuit is configured to produce a plurality of control signals, and a respective one of the plurality of switches is responsive to a respective one of the plurality of control signals to produce one of the first and second states. The programmable logic circuit comprises a plurality of control circuits, a respective one of the plurality of control circuits producing a respective one of the plurality of control signals. The programmable logic circuit may be configured to produce a plurality of input control signals based on the program, with a respective one of the plurality of control circuits being responsive to a respective one of the input control signals to cause the associated switch to connect the associated delay circuit to the clock input of the buffer. Each of the plurality of control circuits may be responsive to a mode input signal to render the associated control circuit unresponsive to the associated input control signal in a first mode and to render the associated control signal responsive to the associated input control signal in a second mode.

A merged memory logic integrated circuit according to another embodiment of the present invention includes a memory. A first adjustable clock generator is configured to produce a first adjustably delayed clock signal. An input buffer is operatively associated with the memory, has a clock input for receiving the first adjustably delayed clock signal and is configured to receive a first input data signal and provide a corresponding first output data signal to the memory therefrom, responsive to the first adjustably delayed clock signal. A second adjustable clock generator is configured to produce a second adjustably delayed clock signal. An output buffer is responsive to the memory, has a clock input for receiving the second adjustably delayed clock signal and is configured to receive a second input data signal from the memory and produce a corresponding second output data signal therefrom, responsive to the second adjustably delayed clock signal. A programmable logic circuit is operatively associated with the first and second adjustable clock generators and is configured to produce the first and second control signals according to a program applied thereto. The first and second adjustable clock generators may produce the first and second adjustably delayed clock signals from a common input clock signal. The adjustable clock generators and the programmable logic circuit may have the structures described above.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
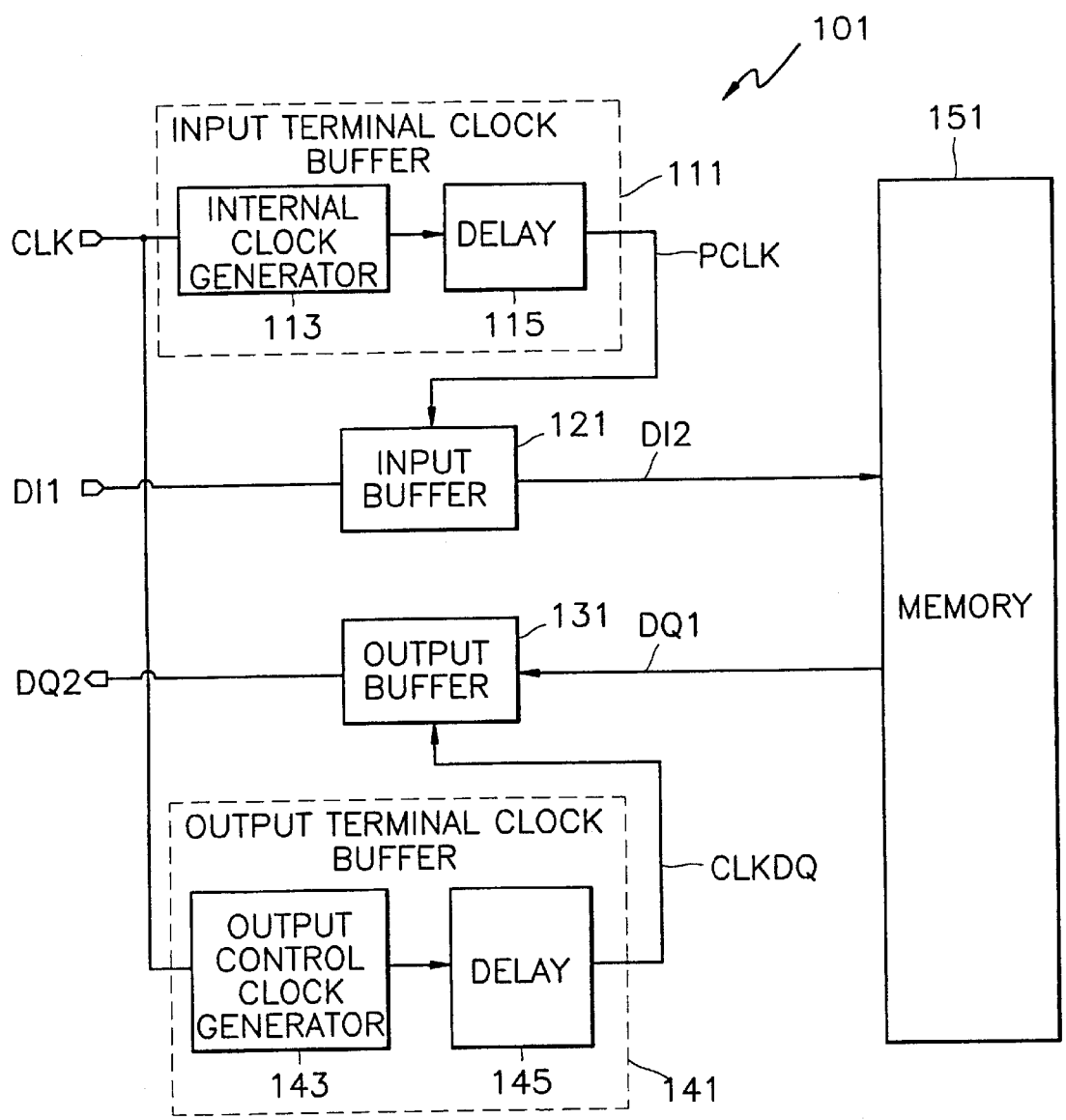
FIG. 1 is schematic diagram illustrating buffer circuitry in a conventional memory integrated circuit.
Figure 2:
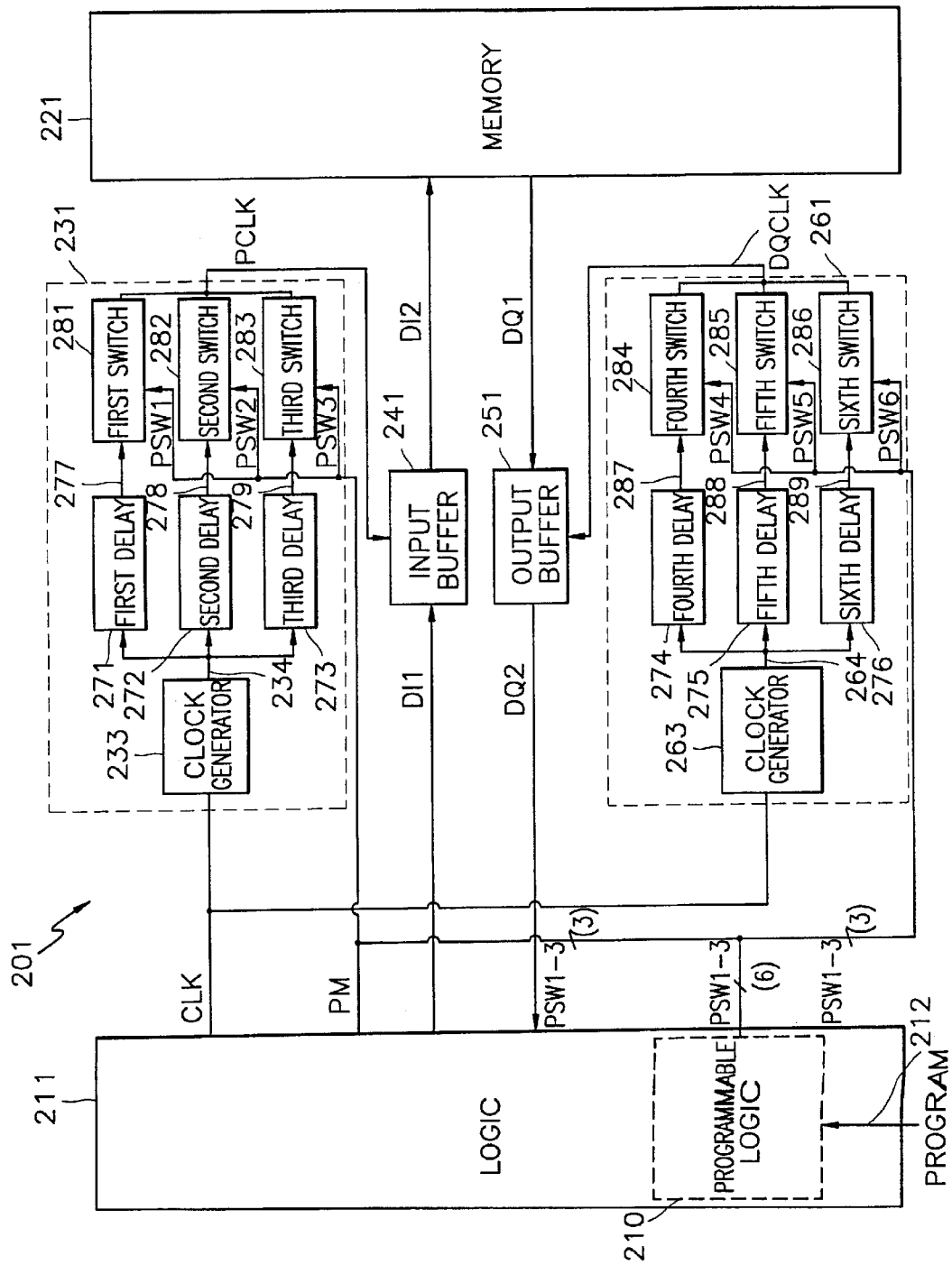
FIG. 2 is a schematic diagram of a merged memory logic (MML) integrated circuit illustrating a buffer circuit according to an embodiment of the present invention.

Referring to FIG. 2, a merged memory logic (MML) integrated circuit 201 includes a logic circuit 211, a memory 221, a first adjustable clock generator 231, an input buffer 241, an output buffer 251 and a second adjustable clock generator 261. The logic circuit 211 generates a clock signal CLK. The first adjustable clock generator 231 receives the clock signal CLK and control signals PSW1-3 from a programmable logic circuit 210 in the logic circuit 211 and provides a first adjustably delayed clock signal PCLK to the input buffer 241 responsively thereto. The second adjustable clock generator 261 receives the clock signal CLK and control signals PSW4-6 from the programmable logic circuit 210 and provides a second adjustably delayed clock signal DQCLK to the output buffer 251 responsively thereto. The programmable logic circuit produces the control signals PSW1-6 according to a program 212 applied to the programmable logic circuit 210.

The first adjustable clock generator 231 includes a clock generator 233 and first, second and third delay circuits 271, 272 and 273 connected to first, second and third switches 281, 282 and 283, respectively. The clock generator 233 generates an output clock signal 234 from the input clock signal CLK. The first, second and third delay circuits 271, 272, 273 produce first, second and third delayed clock signals 277, 278, 279, respectively, which are delayed by respective first, second and third predetermined intervals with respect to the output clock signal 234. For example, the second delay circuit 272 may introduce a delay Ti, and the first and third delay circuits 271, 273 may introduce delays T1-α and T1+α, respectively.

The first, second and third switches 281, 282, 283 are electrically connected to the first, second and third delays 271, 272, 273, respectively, and receive respective control signals PSW1-3 produced by the programmable logic circuit 210. The first, second and third switches 281, 282, 283 selectively connect one of the first, second and third delay circuits 271, 272, 273 to a clock input of the input buffer 241 under control of the associated control signal PSW1-3, thus providing an adjustably delayed clock signal PCLK which is delayed by a selected interval.

The input buffer 241 is electrically connected to the logic 211 and the first adjustable clock generator 231, and transfers data DI1 from the logic 211 to the memory 221 in response to the adjustably delayed clock signal PCLK. For example, when the adjustably delayed clock signal PCLK is at a logic "high" level, the input buffer 241 may be rendered transparent, allowing data DI1 (e.g., data having a TTL or CMOS level) to be transferred as data DI2 at, for example, a CMOS level. When the adjustably delayed clock signal PCLK is at a logic "low" level, the buffer is deactivated, preventing data D1 from being transferred to the memory 221.

Operation of the output buffer 251 under the control of the second adjustable clock generator 261 is similar t that of the input buffer 241, except that data transfer occurs in an opposite direction. The second adjustable clock generator 261 receives the clock signal CLK and the control signals PSW4-6 from the programmable logic circuit 210, and generates an output clock signal DQCLK that is accordingly delayed. The second adjustable clock generator 261 includes a clock generator 263, fourth, fifth and sixth delays 274, 275, 276 and fourth, fifth and sixth switches 284, 285, 286. The clock generator 263 generates an output clock signal 264 from the clock signal CLK, which is provided to the fourth, fifth and sixth delay circuits 274, 275, 276. The fourth, fifth and sixth delay circuits 274, 275, 276 produce fourth, fifth and sixth delayed clock signals 287, 288, 289 which are delayed by respective fourth, fifth and sixth intervals with respect to the output clock signal 264. Fourth, fifth and sixth switches selectively connect one of the fourth, fifth and sixth delayed clock signals 287, 288, 289 to a clock input of the output buffer 251, under the control of the control signal PSW4-6. The output buffer 251 is electrically connected to the logic 211 and the second adjustable clock generator 261, and transfers data DQ1 from the memory 221 to the logic 211 as data line DQ2 in response to the second adjustably delayed clock signal DQCLK.

Those skilled in the art will appreciate that the input buffer 241 and the output buffer 251 may perform buffering functions for a variety of signals applied to the memory 221. For example, the input and output buffers 241, 251 may serve as data buffers for buffering data to memory locations in the memory 221. The buffers 241, 251 may also buffer other types of signals provided to or produced by the memory 221, such as buffers for address signals, row address strobe (RAS) signals, column address strobe (CAS) signals, write enable (WE) signals, output enable (OE) signals and a variety of other control signals.

Figure 3:
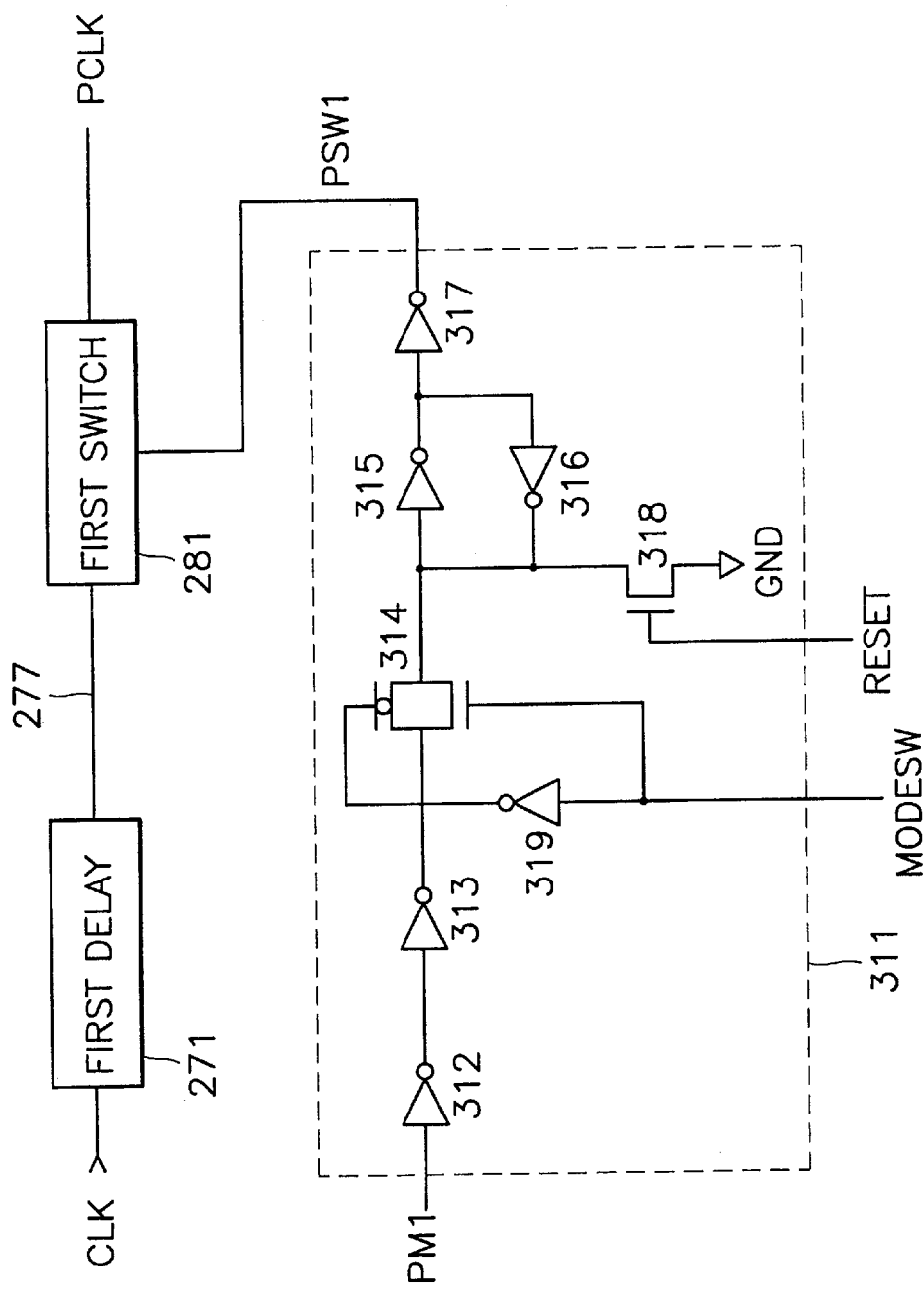
FIG. 3 is a schematic diagram of a control circuit and switch for an adjustable clock generator according to an embodiment of the present invention.

FIG. 3 illustrates a control circuit 311 that may be used to generate control signals such as the control signals PSW1-6 of FIG. 2. An input control signal PM1 drives inverters 312, 313 which precede a pass transistor 314 which is controlled by a mode input signal MODESW through an inverter 319. When the mode input signal MODESW is "high," the pass transistor is "on", allowing the inverter 313 to drive an inverter 315 through the pass transistor 314. The inverter 315 forms a latch circuit with another inverter 316, the latch circuit being resettable by a reset signal RESET through a MOS transistor 318. The output of the latch circuit is fed to yet another inverter 317 to produce a control signal PSW1 which reflects the input control signal PM1 when the mode input signal MODESW is "high." When the mode input signal MODESW is "low," however, the pass transistor 314 is off and the input into the latch circuit is latched at either a "high" or a "low," dependent on the value of the input to the latch circuit before the mode input signal MODESW went "low." In this mode, the output of the control circuit 311 is unresponsive to the input control signal PM1.

The first switch 281 receives a delayed clock signal 277 from the first delay circuit 271. The first switch 281 has a first state in which it connects the first delay circuit 271 to the clock input of the input buffer 241, and a second state in which the first switch 281 disconnects the first delay circuit from the clock input of the input buffer 241. The state of the first switch 281 is controlled by the control signal PSW1 generated by the control circuit 311. For example, when the switch control signal PSW1 has a logic "high" value, the first switch 281 may connect the first delay circuit 271 to the clock input of the input buffer 241, transmitting an adjustably delayed clock signal PCLK which is delayed by the delay interval associated with the first delay circuit 271 with respect to the output clock produced by the clock generator 233. When the switch control signal PSW1 is a logic "low", the first delay circuit 271 may be disconnected from the clock input of the input buffer 241.

Respective control circuits such as the control circuit 311 of FIG. 3 may be provided to control the second and third switches 272, 273, respectively, of FIG. 2. One of the first, second and third delay circuits 271, 272, 273 is selectively connected to the clock input of the input buffer 241, while leaving the other delay circuits disconnected. Operation of the output buffer 251 under the control of the second adjustable clock generator 261 is similar to that described above, with the output buffer transferring data between the memory 221 and the logic 211 under the control of a second adjustably delayed clock signal DQCLK. Those skilled in the art will appreciate that other circuits for generating appropriate control signals to control switches such as those illustrated in FIGS. 2 and 3 may also be used with the present invention, including embodiments using other logic combinations, e.g., complementary logic combinations to the circuits illustrated.

Figure 4:
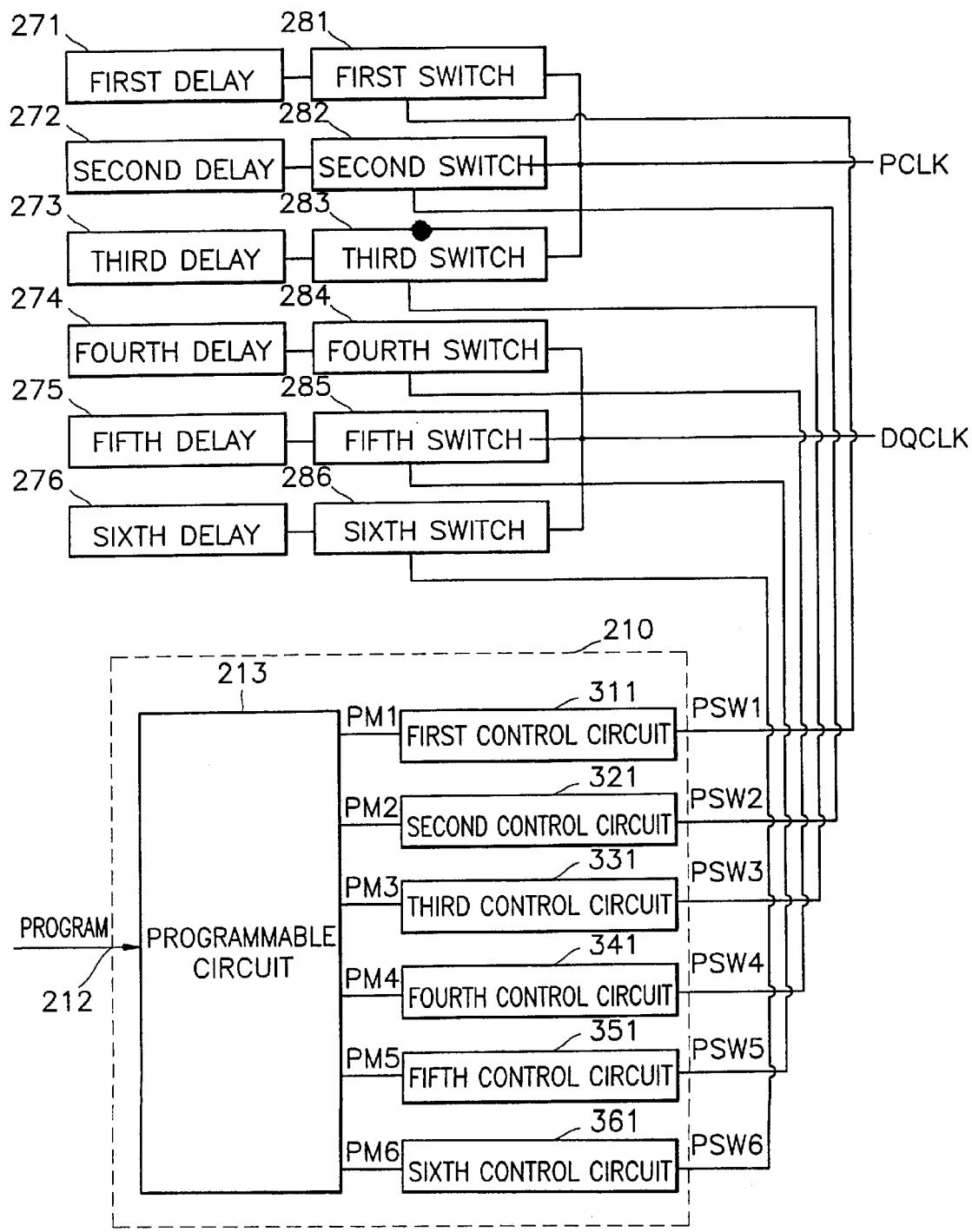
FIG. 4 is a schematic diagram of an array of switches and control circuits for an adjustable clock generator according to another embodiment of the present invention.

As illustrated in FIG. 4, the programmable logic circuit 210 may include a plurality of control circuits 311, 321, 331, 341, 351, 361 of the type illustrated in FIG. 3 which are responsive to input control signals PM1-6 generated by a programmable circuit 213 according to the program 212. The control circuits 311, 321, 331, 341, 351, 361 produce a like plurality of control signals PSW1-PSW6, which in turn control a like plurality of switches 281-286 connected to respective delay circuits 271–276, to produce first and second adjustably delayed clock signals PCLK, DQCLK. A selected one of the first, second and third switches 281–283 is enabled to connect its associated delay circuit to the clock input of the input buffer 241 (see FIG. 2) by programming the programmable circuit 213 to produce appropriate control signals PM1–PM3 to enable one of the first, second and third switches 281–283. Similarly, a selected one of the fourth, fifth and sixth switches 284–286 is enabled to connect its associated delay circuit to the clock input of the output buffer 251 by programming the programmable circuit 213 to produce the appropriate control signals PM4–6.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A merged memory logic (MML) integrated circuit, comprising:

a memory;

an adjustable clock generator configured to produce an adjustably delayed clock signal that is adjustably delayed with respect to a clock signal responsive to a control signal applied to said adjustable clock generator;

a buffer, operatively associated with said memory, having a clock input for receiving said adjustably delayed clock signal and configured to receive an input data signal and produce a corresponding output data signal therefrom responsive to said adjustably delayed clock signal; and a programmable logic circuit operatively associated with said adjustable clock generator which is configured to produce said control signal according to a program applied thereto.

2. A MML integrated circuit according to claim 1, wherein said adjustable clock generator is configured to receive an input clock signal and produce said adjustably delayed clock signal therefrom, said adjustably delayed clock signal being delayed with respect to said input clock signal by an adjustable interval.

3. A MML integrated circuit according to claim 2, wherein said adjustable clock generator comprises:

a clock generator configured to receive said input clock signal and produce a output clock signal therefrom; and an adjustable delay circuit which receives said output clock signal and generates said adjustably delayed clock signal therefrom, said adjustably delayed clock signal being delayed with respect to said output clock signal by a selected one of a plurality of selectable delay intervals.

4. A MML integrated circuit according to claim 3, wherein said adjustable delay circuit comprises:

a plurality of delay circuits, a respective one of which is configured to receive said output clock signal and produce a respective delayed clock signal therefrom, said delayed clock signal being delayed a respective predetermined delay with respect to said output clock signal; and means, operatively associated with said plurality of delay circuits, for selectively coupling one of said delayed clock signals to said clock input of said buffer.

5. A MML integrated circuit according to claim 4, wherein said means for selectively coupling comprises a plurality of switches, each of said plurality of switches having a first state in which said switch disconnects the associated delay circuit from said clock input of said buffer and a second state in which said switch connects the associated delay circuit to said clock input of said buffer.

6. A MML integrated circuit according to claim 5, wherein said programmable logic circuit is configured to produce a plurality of control signals, and wherein a respective one of said plurality of switches is responsive to a respective one of said plurality of control signals to produce one of said first and second states.

7. A MML integrated circuit according to claim 6, wherein said programmable logic circuit comprises a plurality of control circuits, a respective one of said plurality of control circuits producing a respective one of said plurality of control signals.

8. A MML integrated circuit according to claim 7, wherein said programmable logic circuit is configured to produce a plurality of input control signals based on said program, and wherein a respective one of said plurality of control circuits is responsive to a respective one of said input control signals to cause the associated switch to connect the associated delay circuit to said clock input of said buffer.

9. A MML integrated circuit according to claim 8, wherein each of said plurality of control circuits is responsive to a mode input signal to render the associated control circuit unresponsive to the associated input control signal in a first mode and to render the associated control circuit responsive to the associated input control signal in a second mode.

10. A merged memory logic (MML) integrated circuit, comprising:
- a memory;
- a first adjustable clock generator configured to produce a first adjustably delayed clock signal that is adjustably delayed with respect to a first clock signal responsive to a first control signal applied to said first adjustable clock generator;
- an input buffer, operatively associated with said memory, said input buffer having a clock input for receiving said first adjustably delayed clock signal and configured to receive a first input data signal and provide a corresponding first output data signal to said memory therefrom, responsive to said first adjustably delayed clock signal;
- a second adjustable clock generator configured to produce a second adjustably delayed clock signal that is adjustable delayed with respect to a second clock signal responsive to a second control signal applied to said second adjustable clock generator;
- an output buffer, responsive to said memory, said output buffer having a clock input for receiving said second adjustably delayed clock signal and configured to receive a second input data signal from said memory and produce a corresponding second output data signal therefrom, responsive to said second adjustably delayed clock signal; and
- a programmable logic circuit operatively associated with said first and second adjustable clock generators which is configured to produce said first and second control signals according to a program applied thereto.

11. A MML integrated circuit according to claim 10;
wherein said first adjustable clock generator is configured to receive a first input clock signal and produce the first adjustably delayed clock signal therefrom, the first adjustably delayed clock signal being delayed with respect to said first input clock signal by a first adjustable interval; and
wherein said second adjustable clock generator is configured to receive a second input clock signal and produce the second adjustably delayed clock signal therefrom, the second adjustably delayed clock signal being delayed with respect to said second input clock signal by a second adjustable interval.

12. A MML integrated circuit according to claim 11, wherein said first and second input clock signal comprise a common input clock signal, and wherein the MML integrated circuit further comprises a logic circuit which produces said common input clock signal.

13. A MML integrated circuit according to claim 12:
wherein a respective one of said first and second adjustable clock generators comprises:
- a clock generator configured to receive the common input clock signal and produce an output clock signal therefrom; and
- an adjustable delay circuit which receives said output clock signal and generates the associated adjustably delayed clock signal therefrom, the associated adjustably delayed clock signal being delayed with respect to said output clock signal by a selected one of a plurality of selectable delay intervals.

14. A MML integrated circuit according to claim 13, wherein said adjustable delay circuit comprises:
- a plurality of delay circuits, a respective one of which is configured to receive said output clock signal and produce a respective delayed clock signal therefrom, said delayed clock signal being delayed a respective predetermined delay with respect to said output clock signal; and
- means, operatively associated with said plurality of delay circuit, for selectively coupling one of said delayed clock signals to the clock input of the associated buffer.

15. A MML integrated circuit according to claim 14, wherein said means for selectively coupling comprises a plurality of switches, each of said plurality of switches having a first state in which said switch disconnects the associated delay circuit from said clock input of the associated buffer and a second state in which said switch connects the associated delay circuit to the clock input of the associated buffer.

16. A MML integrated circuit according to claim 15, wherein said programmable logic circuit is configured to produce a plurality of control signals, and wherein a respective one of said plurality of switches is responsive to a respective one of said plurality of control signals to produce one of said first and second states.

17. A MML integrated circuit according to claim 16, wherein said programmable logic circuit comprises a plurality of control circuits, a respective one of said plurality of control circuits producing a respective one of said plurality of control signals.

18. A MML integrated circuit according to claim 17, wherein said programmable logic circuit is configured to produce a plurality of input control signals based on said program, and wherein a respective one of said plurality of control circuits is responsive to a respective one of said input control signals to cause the associated switch to connect the associated delay circuit to said clock input of said associated buffer.

19. A MML integrated circuit according to claim 18, wherein each of said plurality of control circuits is responsive to a mode input signal to render the associated control circuit unresponsive to the associated input control signal in a first mode and to render the associated control circuit responsive to the associated input control signal in a second mode.

* * * * *